United States Patent [19]
Wahlstrom

[11] Patent Number: 5,396,452
[45] Date of Patent: Mar. 7, 1995

[54] DYNAMIC RANDOM ACCESS MEMORY

[76] Inventor: Sven E. Wahlstrom, 570 Jackson Dr., Palo Alto, Calif. 94303

[21] Appl. No.: 86,222

[22] Filed: Jul. 2, 1993

[51] Int. Cl.⁶ .............................................. G11C 11/24
[52] U.S. Cl. .................................. 365/149; 365/187; 365/188; 437/915
[58] Field of Search ............... 365/149, 187, 188, 145, 365/205, 210, 189.01; 437/51, 915

[56] References Cited

U.S. PATENT DOCUMENTS

| | | | |
|---|---|---|---|
| 3,593,037 | 7/1971 | Hoff, Jr. .............................. | 307/238 |
| 3,876,991 | 4/1975 | Nelson et al. ...................... | 365/187 |
| 4,829,018 | 4/1989 | Wahlstrom .......................... | 437/51 |
| 5,127,739 | 7/1992 | Duvvury et al. ................... | 365/205 |

FOREIGN PATENT DOCUMENTS 0175378  3/1986  European Pat. Off. ............ 365/187

OTHER PUBLICATIONS

Itoh, "Trends in Megabit DRAM Circuit Design," reprinted from *IEEE JSSC*, Jun. 1990, pp. 778–789, in Section 3.2: MOS.

"Dynamic RAMS, Paper 3.8," *Digital MOS Integrated Circuits II*, IEEE Press, New York, N.Y., 1992, pp. 353–363.

*Primary Examiner*—Eugene R. LaRoche
*Assistant Examiner*—F. Niranjan
*Attorney, Agent, or Firm*—Townsend and Townsend Khourie and Crew

[57] ABSTRACT

A dynamic random access memory. The memory includes a write transistor N3 and a read transistor N2. In a preferred embodiment the write transistor has a threshold level higher than the read transistor. A sense amplifier senses and amplifies a difference in voltage between a bit line and a sense node that is developed when the read transistor permits or does not permit current to flow between ground an a bit line. Associated semiconductor device structures and fabrication techniques are also disclosed.

11 Claims, 14 Drawing Sheets

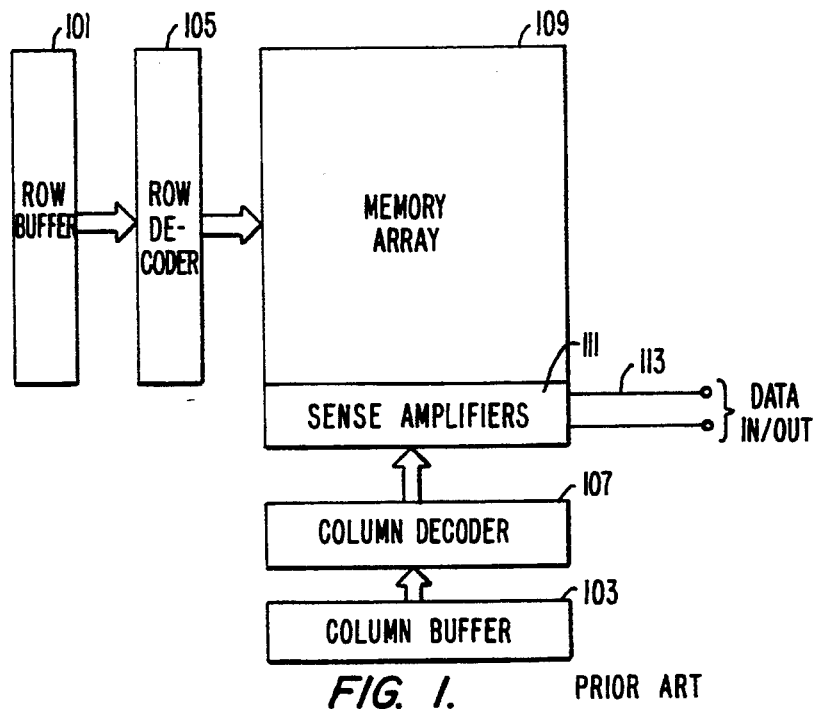
FIG. 1. PRIOR ART
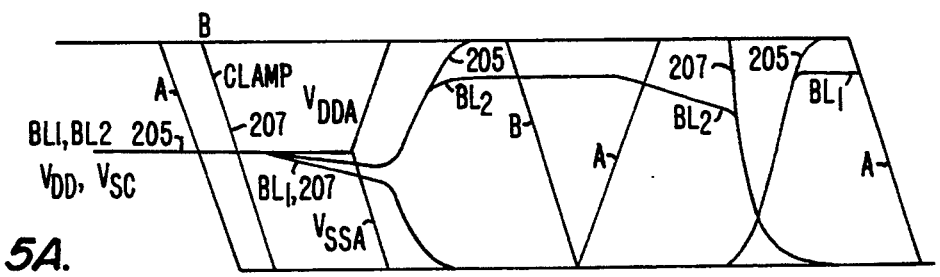
FIG. 5A.
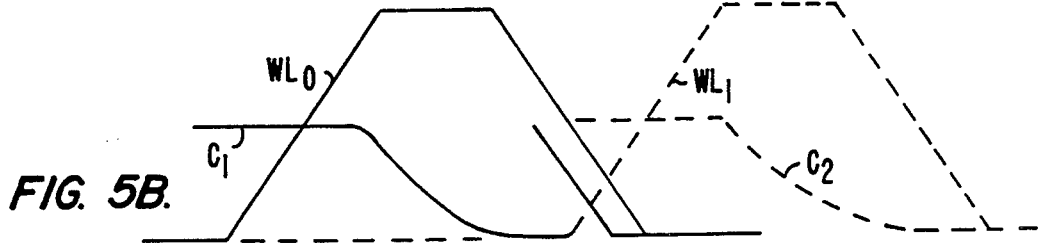
FIG. 5B.
FIG. 5C. DATA IN STROBE

DYNAMIC RANDOM ACCESS MEMORY

BACKGROUND OF THE INVENTION

The present invention relates to the field of integrated circuits, their operation, and manufacture. More specifically, in one embodiment the invention provides improved dynamic random access memories, methods of operating a dynamic random access memories, and methods of making a dynamic random access memories.

In the attempt to increase the number of bits on present DRAMs, elaborate processes are proposed for shrinking device dimensions, while still maintaining high enough capacitance in the storage capacitors so that data can be reliably stored, refreshed, and read. For a given bit line capacitance, parameters of primary importance in a read operation are the proportional capacitance of the storage capacitor and the voltage difference between the capacitor and the bit line. The "primary" signal in a DRAM, which is the signal on the floating bit lines before enabling the amplifier, must be larger than the deviation in the switching point between the two nodes of the amplifier.

Deviation of the switching points in the amplifier arises due to the variation in the transistor parameters of the sense amplifier. In a typical DRAM, this variation is often at least 100 mV. Other factors, such as supply variations and coupling from crossing signals may require even larger primary signals. To satisfy this requirement, a cell capacitance of 30 fF is typically required in today's DRAM devices.

While meeting with substantial success, such DRAMs have also met with certain limitations. For example, as the size of DRAMs has increased due to reductions in feature size, difficulties have been encountered in keeping the primary signal above the needed level. This has, in turn, limited the number of bits that can be placed on a bit line and, therefore, the achievable number of bits on a single DRAM substrate. Other difficulties include decreased yield and the like.

From the above it is seen that an improved dynamic random access memory is needed, along with improved methods of operating such memories and improved methods of making such memories.

SUMMARY OF THE INVENTION

An improved dynamic random access memory (DRAM) is provided by virtue of the present invention, along with an improved method of operating dynamic memory and improved method of making a dynamic memory. The DRAM according to this invention provides a large primary signal with a very small storage capacitor, often less than 10 fF. More than one transistor is included in each cell, but well established CMOS processes can be used in the manufacturing of this type of memory. According to one aspect of the invention, an improved fabrication process is utilized that further reduces effective cell size.

According to one aspect of the invention, an improved dynamic random access memory is provided. The dynamic random access memory which includes a plurality of memory cells at the intersections of word lines and bit lines, where each memory cell includes a storage capacitor for storing charge representative of a stored data value; a first, write transistor coupled to a first plate of the storage capacitor and a bit line; and a second, read transistor having a first terminal coupled to a first terminal of a third transistor and a second terminal coupled to a bit line, the third transistor comprising a gate coupled to the first plate of the storage capacitor, the word line forming a gate of both the read transistor and the write transistor. Each memory cell also has a sense node. Further, in another aspect of the invention, the dynamic random access cell includes a storage capacitor in a first semiconductor layer, transistor elements in a second semiconductor layer, above the first layer, where both first and second layers are substantially parallel with the surface of a substrate wafer. Moreover, the storage capacitor in the first layer is coupled to and placed beneath the transistor elements in the second layer.

Furthermore, a multisided capacitor for an integrated circuit, having stacked substrate layers separated by fused dielectric layers formed by a fused dielectric multilayer process is provided. The multisided capacitor includes a plurality of polysilicon gate layer plates, stacked above a gate oxide layer and above a substrate layer, and stacked below a fused dielectric layer and below a substrate layer. The plurality of polysilicon gates plates are coupled together to form one terminal of the capacitor. A plurality of plates of the capacitor in the plurality of substrate layers are placed at a fixed potential to form a second terminal of said capacitor.

In the fabrication of multilevel semiconductor integrated circuits, a method of forming a dynamic random access memory cell in multilayers of silicon semiconductor material including the steps of providing a first silicon substrate, forming a storage capacitor on the first substrate for the memory cell, and forming a first dielectric layer on a surface of the first substrate and the capacitor. Further steps include providing a second silicon substrate, forming a first silicon epitaxial layer on one surface and a second dielectric layer on a surface of the first epitaxial layer are formed on the second silicon substrate, stacking the second substrate on the first substrate, with first and second silicon dielectric layers in contact, fusing the dielectric layers together, and forming a oxide fusion interface. The next steps include removing the second substrate by etching thereby leaving the first substrate as support for first epitaxial layer, forming no fewer than one electrical component in the first epitaxial layer, and coupling the storage capacitor to the electrical component to form a dynamic random access memory cell.

An improved method of operating a dynamic random access memory is provided, which includes the steps of storing a charge representing a data value in a memory cell capacitance, activating a word line to couple the memory cell to a bit line, the charge in the memory cell either permitting or not permitting a selected current to flow to the bit line depending upon the data value, sensing a difference in voltage between two sense nodes with a sense amplifier, the voltage difference established by the selected current flow and a reference current flow to a sense node, and activating the word line to restore charge in the memory cell capacitance.

A further understanding of the nature and advantages of the inventions herein may be realized by reference to the remaining portions of the specification and the attached drawings.

BRIEF DESCRIPTION OF THE DRAWINGS

FIG. 1 is a simplified overall illustration of a dynamic random access memory;

FIGS. 5A to 5C illustrate a write to a block without a clamp between words;

DESCRIPTION OF THE PREFERRED EMBODIMENTS

Figure 2:
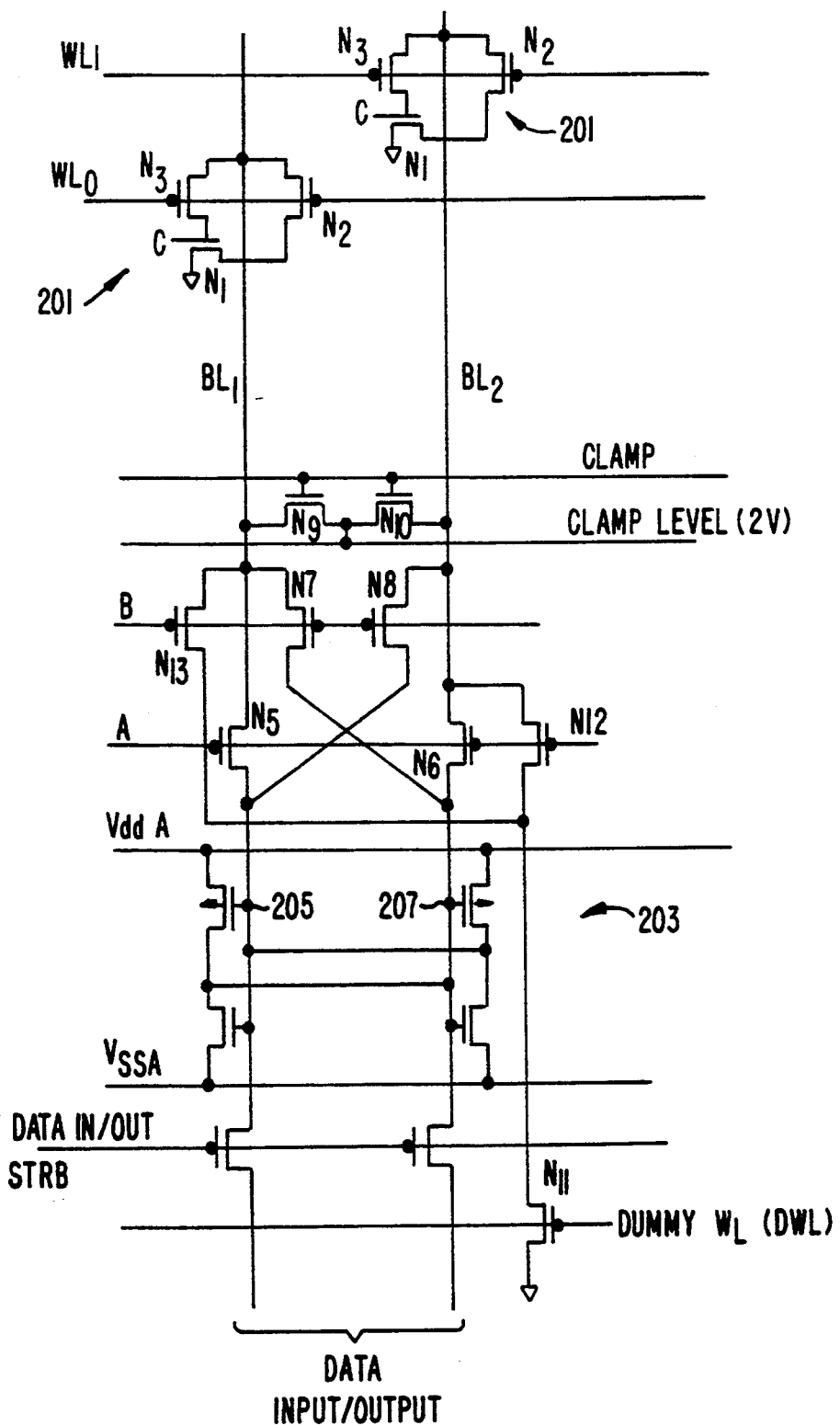
FIG. 2 illustrates the sense amplifier and cells for a memory according to one aspect of the invention.

FIG. 1 is a simplified overall block diagram of a typical dynamic random access memory (DRAM) according to one embodiment of the invention, this particular arrangement being most appropriate for certain folded word line configurations. According to the embodiment shown in FIG. 1 a row address buffer 101 and a column address buffer are 103 utilized to store row and column information input to the chip via external pins. Upon the application of appropriate row and column signals, the row and column addresses are applied to row and column decoders 105 and 107, respectively.

Row decoder 105 selects memory cells along a selected row in memory array 109 for sensing by sense amplifiers 111. Column decoder 107 selects data from among the sense amplifiers for output along output bus(es) 113.

FIG. 2 illustrates aspects of memory cells and the sense amplifier shown in FIG. 1 in greater detail. Two cells are shown in FIG. 2, one associated with an odd word line and one associated with an even word line. It will be recognized that a typical DRAM will have one or more large arrays of such cells, and that two are shown for purposes of illustration.

Each cell 201 has transistors N1 and N2 connected in series between a bit line and ground. A first electrode of a storage capacitor C is coupled to the gate of N1, while the second electrode of the capacitor is coupled to ground together with the source of N1. The drain of N1 connects to the source of N2 and the drain of N2 connects to a bit line $BL_i$. A-word line $WL_i$ connects to the gate of N2. A third transistor N3 has a first terminal connected to the first electrode of the capacitor and a second terminal connected to the bit line. The word line $WL_i$ is also coupled to the gate of N3.

The word line is used for both reading and writing. In order to separate the two functions, N3 has a much higher threshold voltage than N1 and N2 in one embodiment of the invention. For example, in a 5-volt system, $V_{th}$ for N3 may be 2.5 volts and $V_{th}$ for N1 and N2 may be 0.7 volts. The threshold for N3 can be made higher through, for example, the use of a separate threshold implant or by adjusting the gate oxide thickness.

The sense amplifier 203 in FIG. 2 is a cross-coupled latch of the type typically used in DRAMs. A folded bit line configuration is shown here, but the operation would be the same if BL2 was running in the opposite direction (i.e., an open bit line configuration). The sense amplifier includes a cross-coupled pair of PMOS transistors and a cross-coupled pair of NMOS transistors. The sources of the PMOS transistors are coupled to a high voltage level $V_{dd}A$, while the sources of the NMOS transistors are coupled to a low voltage level $V_{ss}A$. A high signal on node A in the amplifier connects BL1 to node 205 and BL2 to node 207. A high on B on the other hand crosses the connections so that BL1 connects to node 207 and BL2 connects to node 205. A signal CLAMP applied to the gates of N9 and N10 connects the bit lines to a reference level (CLAMP LEVEL), which is, for example, approximately 2 volts in a 5-volt system. Data are output after sensing by activating a signal DATA IN/OUT STRB.

This type of memory cell draws a fixed and continuous current from the bit line during sensing when a one is stored. This differs from the present DRAMs, where only a minute charge is transferred. To distinguish between a one and a zero, a balancing dummy current is applied to the bit line opposite to the one presently read. This dummy current is chosen in the example herein to be a little less than half the current from a cell with a one stored. N11 in series with N12 or N13 are designed to deliver the correct dummy current. When the signal DUMMY WL (or DWL) is active, the dummy current is applied to either BL1 or BL2 depending on whether A or B is active.

Figure 3A:
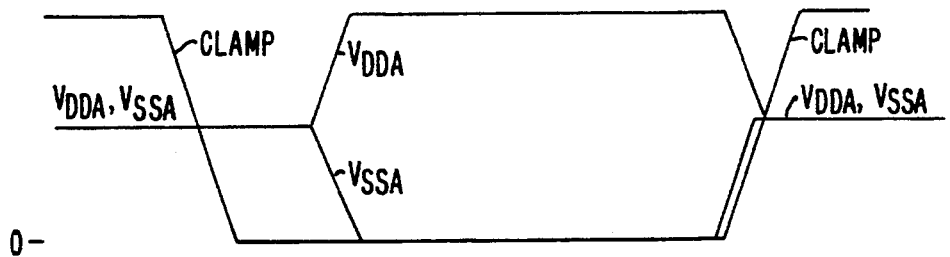
FIGS. 3A to 3F illustrate a read/restore timing diagram for one embodiment of a DRAM according to the present invention.
Figure 3B:
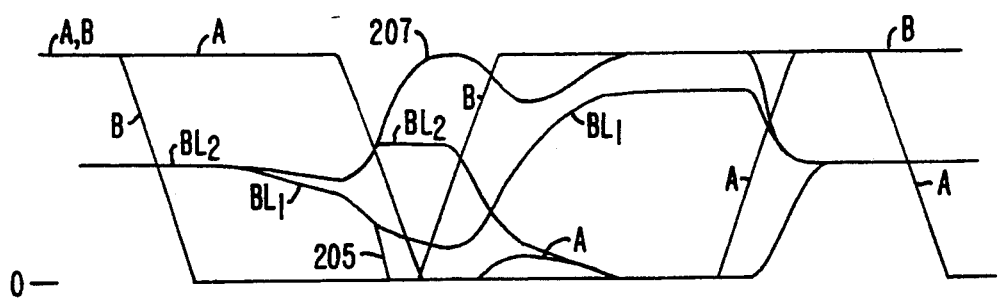
Figure 3C:
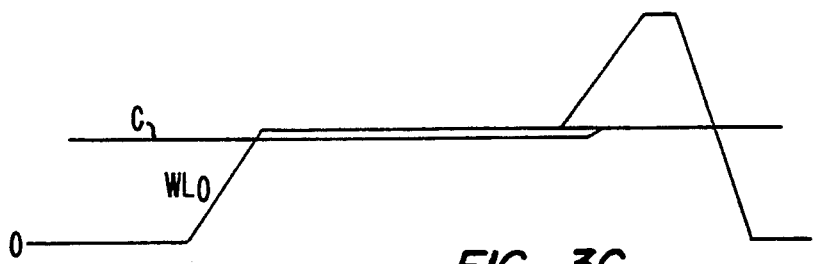
Figure 3D:
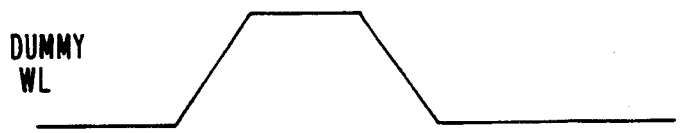
Figure 3E:
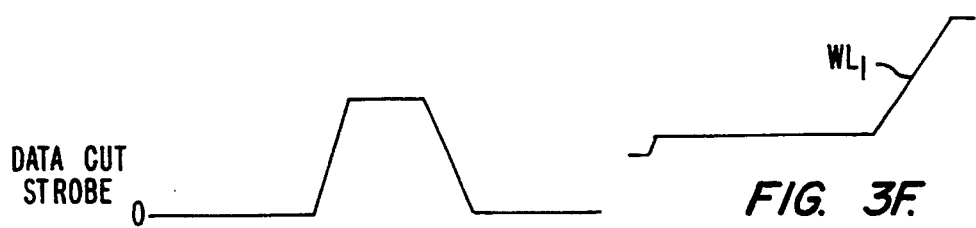
Figure 3F:
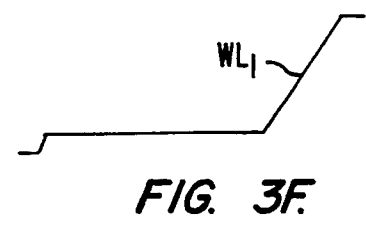

The function of the circuit in FIG. 2 is best understood in connection with the timing diagrams in FIGS. 3A to 3F. The figures show a read restore cycle, with the clamp signal and the amplifier supply voltages shown in FIG. 3A. The control signals A (for an odd address read) and B (for an even address read), and the responses on BL1, BL2, node 205, and node 207 are shown in FIG. 3B. WL0 and the capacitor voltage C are shown in FIG. 3C, and the dummy WL, WL1 and DATA OUT are shown in FIGS. 3D to 3F. In this case, a read is performed from the cell on WL0, where a high level (arbitrarily defined as a "1") is stored.

In standby and between refresh cycles, the amplifier is in clamp mode, when CLAMP, A, and B high, and with BL1, BL2, amplifier nodes 205 and 207, $V_{dd}A$ and $V_{ss}A$ all clamped to the clamp level. The word lines are at ground level. To read a bit on BL1, the clamp and B are brought low, leaving the bit lines floating while still connected to the amplifier nodes. Next WL0 and DWL are brought to the clamp level. This turns on transistor N2 in the cell and transistor N11 coupled the amplifier, but not transistor N3. If C is storing a high charge (the voltage is approximately 2.5 volts) a current I is drawn from BL1, decreasing its voltage linearly with time. At the same time a current I/2 is drawn from BL2, reducing the voltage on BL2 at half the rate of the reduction on BL1.

Node 205 of the amplifier is still connected to BL1 and node 207 is connected to BL2 as long as A is high. Applying power to the amplifier by bringing $V_{dd}A$ to $V_{dd}$ and $V_{ss}A$ to ground will start amplifying the separation between the bit lines. The gain of the amplifier is low in the beginning, and the high capacitive load from the bit lines slows the rate of change. The amplifier is therefore temporarily disconnected from the bit lines by bringing A low.

The amplifier is now loaded only by its internal nodes and switches very fast with node 207 at $V_{dd}$ and node 205 at ground. This is the moment in the read mode when data is transferred to the data output buffers. DWL is brought low at the same time as A goes low because it has served its purpose at this time. WL0 may stay at the clamp level as indicated in the diagram or may temporarily be brought to ground concurrently with DWL, as indicated by dotted lines. With A low, BL1 will continue to be slowly pulled low by the cell current (or if WL0 was returned to ground, stay at its last level, when A went low), and BL2 will float at its last level, when A went low. When the amplifier as mentioned above has reached its final level, B is brought high. This connects BL1 to node 207 and BL2 to node 205, thus reversing the polarity of the bit lines. The amplifier gain at this time is high, providing a strong drive, forcing BL1 high and BL2 low. As soon as BL1 has risen above 2.5 volts, WL0 is brought to the $V_{dd}$ level. This turns on transistor N3 in the cell, and the voltage on C returns to 2.5 volts. Notice that there is no negative disturbance on C, only a correction for charge leaked from C since the last refresh. This means that a refresh does not necessarily have to follow a read operation since a read is non-destructive.

Bringing the bit lines low or high while refreshing requires current from the $V_{dd}$ supply and returns current to ground. As most of this current is in short pulses, care must be taken to make the ground and the $V_{dd}$ current equal, to minimize voltage transients. The clamp level is therefore chosen to be half of the voltage difference between a high and low bit line. The deviation of the voltage of the bit lines from the clamp level before writing should also be minimized. To satisfy the last condition, A may optionally be brought low before power is applied to the amplifier. In addition, the option mentioned above of returning WL0 to ground after reading will leave the bit lines close to the clamp level. The actual deviation will typically be no more than 300 mV. The configuration in FIG. 2 adds one more current pulse to the $V_{dd}$ load. When a high level is stored on the capacitor, bringing WL0 to $V_{dd}$ turns N2 on more strongly than during reading and a current flows through N2 and N1 to ground. This current reduces the positive voltage on BL1, which is acceptable, as long as the voltage on BL1 remains above 2.5 volts.

Figure 4A:
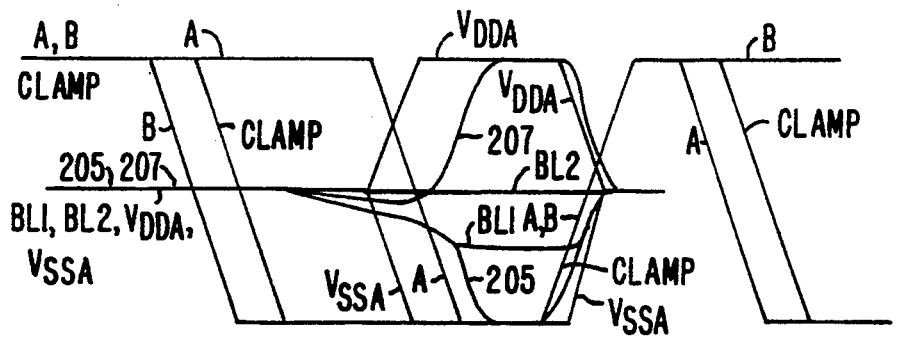
FIGS. 4A to 4D illustrate a fast read with restore interrupted timing diagram.
Figure 4B:
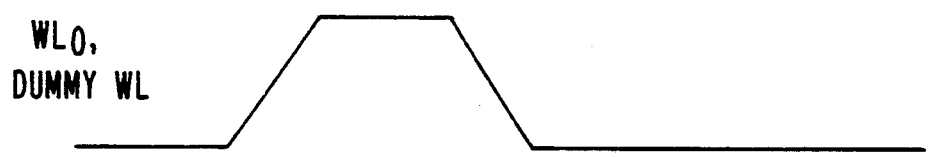
Figure 4C:
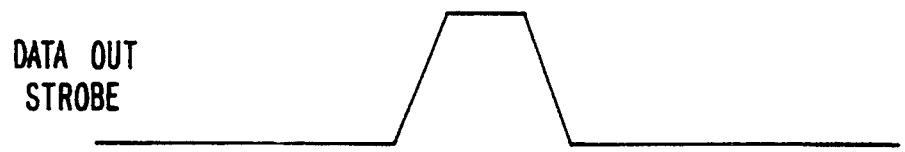
Figure 4D:

FIGS. 4A to 4D show timing diagrams typical for reading blocks of data for the cell on WL0 without interruptions for refresh. FIGS. 5A to 5C show a case of writing a block of data without interruption for refresh. A and B are both low at this time, so that the bit lines are disconnected from the amplifier nodes. Also note that $V_{dd}A$ and $V_{ss}A$ are returned to the clamp level after reading. As shown in FIG. 4A, after a data readout, the A and B signals are not manipulated to provide a refresh of the cell capacitor. Instead, a new read cycle is conducted after the completion of the data readout.

As shown in FIGS. 5A to 5C, the write phase is not interrupted by a clamp phase. Input is shown for a previously stored one level written to a zero level on WL0 and a zero level written on WL1. As shown in this case, the word lines are brought to full $V_{cc}$. Even though the threshold of transistors N3 is higher, a full $V_{cc}$ on the word line allows a writing of a 1 to the storage capacitor C. If a clamp phase is added to reduce the load on the I/O circuits, the time required for the write phase may be longer.

Figure 6:
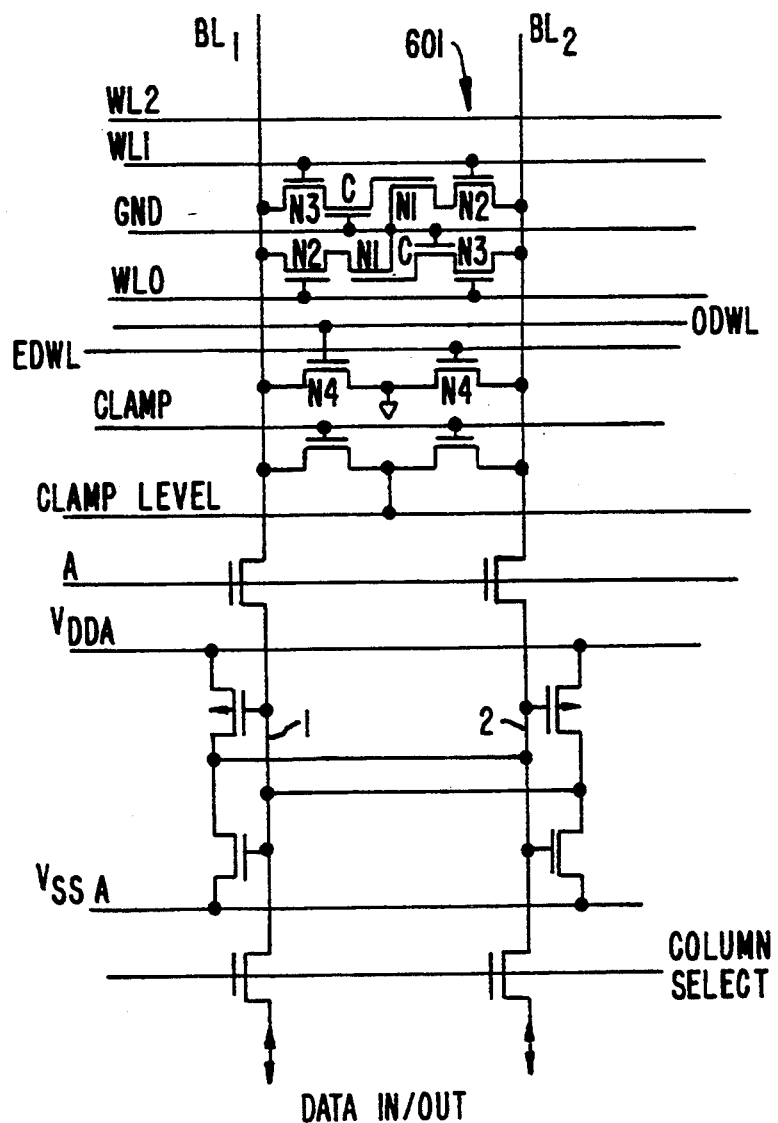
FIG. 6 is a schematic illustrating cells with folded bit lines.

FIG. 6 shows an alternative embodiment of the invention. Again, write transistors N3 with a higher threshold (e.g., 2.5 v) are used along with read transistors N2 with a lower threshold (e.g., 0.7 v). The cells 601 in FIG. 6 take advantage of the folded bit line design in that the write and read transistors are connected to opposite bit lines in the pair. The even word line WL0, for example, addresses a cell where the read transistor N2 is connected to BL1 and the write transistor N3 is connected to BL2. On the other hand, the odd word line WL1 selects a cell with the read transistor N2 connected to BL2 and the write transistor N3 connected to BL1. In this configuration, only one signal, A, is used to connect the amplifier to the bit lines because the inverted output is taken from the bit line opposite to the one which the read signal is applied.

Figure 7A:
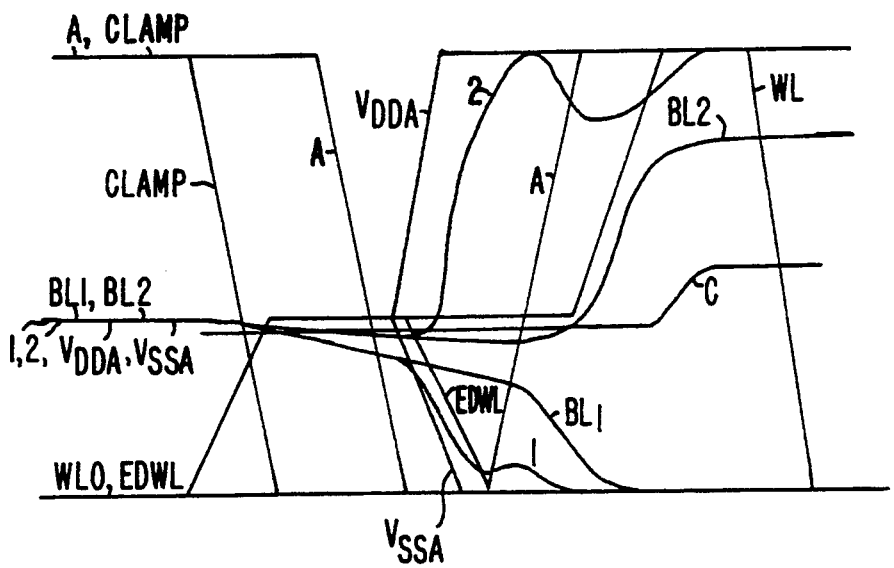
FIGS. 7A to 7B illustrate timing for the circuit in FIG. 6 without word line boost.
Figure 7B:
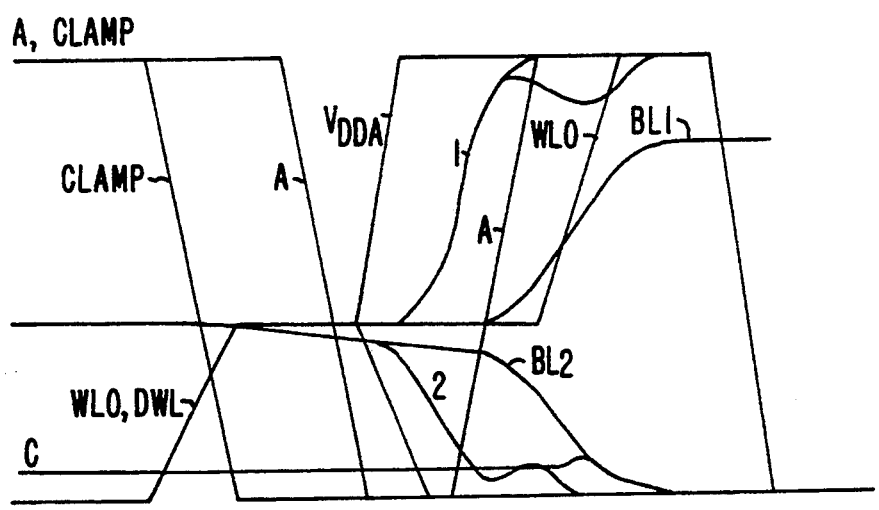

The operation of the circuit in FIG. 6 is best explained using the timing diagram in FIGS. 7A to 7B. FIGS. 7A to 7B show both the cases when a high and low voltage are stored in C. Both A and CLAMP are high in the clamp mode and power is disconnected from the amplifier. When CLAMP goes low and WL0 and the even dummy word line EDWL goes to the clamp level (i.e., 2 V), BL1 starts losing voltage at a fixed rate due to the current through N1 and N2. The voltage on BL2 drops at about half the rate. When the voltage difference exceeds about 100 mV, A is brought low and power is applied to the amplifier. The amplifier switches fast with node 205 going to ground and node 207 going to $V_{dd}$. As before, data are read out at this time. A is brought high again, bringing BL1 to ground and BL2 to one threshold below $V_{dd}$. By now increasing WL0 to the $V_{dd}$ level any voltage loss in C due to leakage since the last refresh will be resupplied. The new voltage will be $V_{dd}$ minus the threshold voltage of N3 (i.e., 2.5 v), which is 2.5 volts. The drain of N2 is now at ground level, so no parasitic current is drawn from the bit line as in the earlier case.

When a low voltage is stored in C only BL2 is gradually pulled low in the early read phase, causing the amplifier to switch so that node 207 goes low and node 205 goes to $V_{dd}$. Making A high in the write mode brings BL2 to ground and BL1 to 4 volts. Bringing WL0 toward $V_{dd}$ connects C to BL2 and thus, returns C to ground level.

Figure 8:
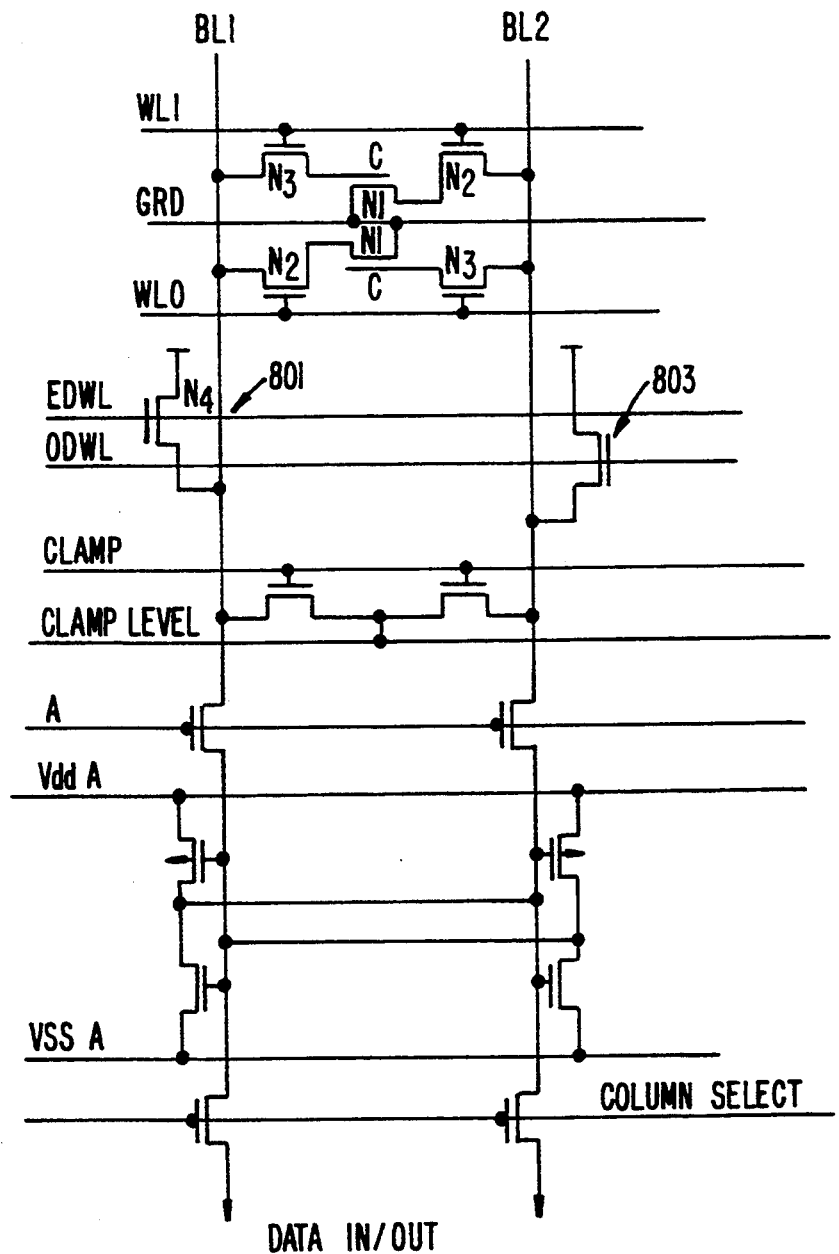
FIG. 8 is a schematic illustrating a circuit with folded bit lines and dummy transistor pull-ups on the bit lines.

Maintaining symmetry in the voltage levels of the bit lines around the clamp level reduces induced noise on the chip. By letting both the read transistor and the dummy transistor displace the bit lines in the same direction (i.e., toward ground), a small imbalance is created. As indicated in FIG. 8, the dummy lines may result in the bit line being pulled up via transistors 801 and 803. By bringing both the word line and dummy word line low before disconnecting the amplifier, symmetry is maintained. The even dummy transistor is now connected to the same bit line as the one to which the read transistor in the cell is connected. EDWL is applied to a transistor that pulls BL1 high. At the same time, WL0 turns on an N2, which when C is high, pulls the same bit line low. The selected bit line will initially go up or down at a slow rate and stay flat when the word lines go low and are disconnected from the amplifier by A.

FIGS. 9A to 9F illustrate the timing relations in detail for the circuitry shown in FIG. 8. After turning on the word lines, the floating word lines are separated sufficiently at the time power is applied to the amplifier to cause switching in the "right" direction. If this switching starts while A is still active, the bit lines will track the amplifier. This causes some delay in the amplifier. This delay can be avoided if A disconnects the bit lines before power is applied to the amplifier. It takes some time after A goes high in the refresh mode before the bit lines reach their proper levels. The low going bit line should reach ground level before WL0 reaches the level of $V_{th}3$, the threshold voltage of N3. The high going bit line should reach at least $V_{dd}$ minus $V_{th}3$ before WL0 reaches $V_{dd}$. In the figure, WL0 is illustrated as being a little too early, causing a temporary disturbance on C.

Figure 9A:
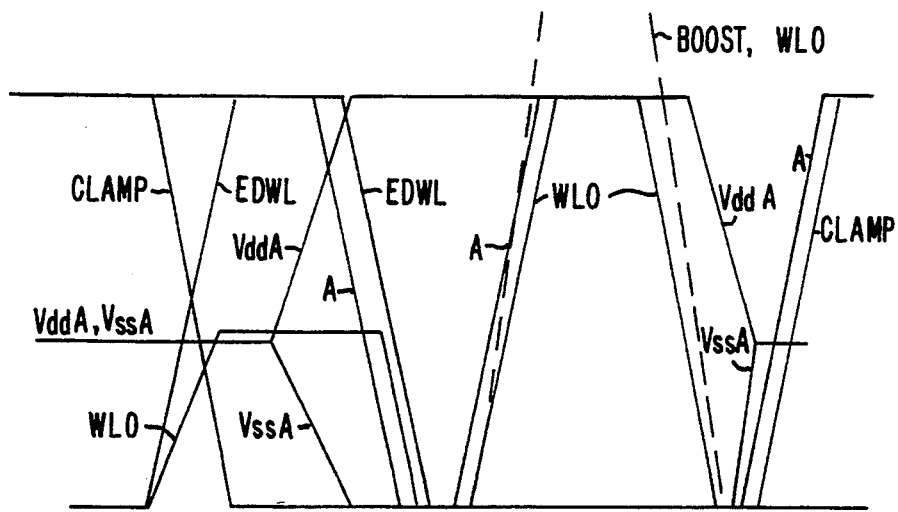
FIGS. 9A to 9F illustrate timing for the circuit in FIG. 8.
Figure 9B:
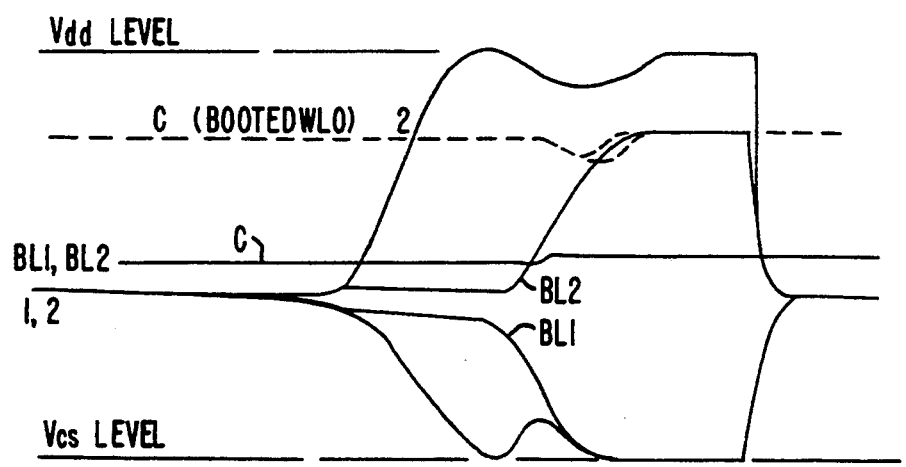
Figure 9C:
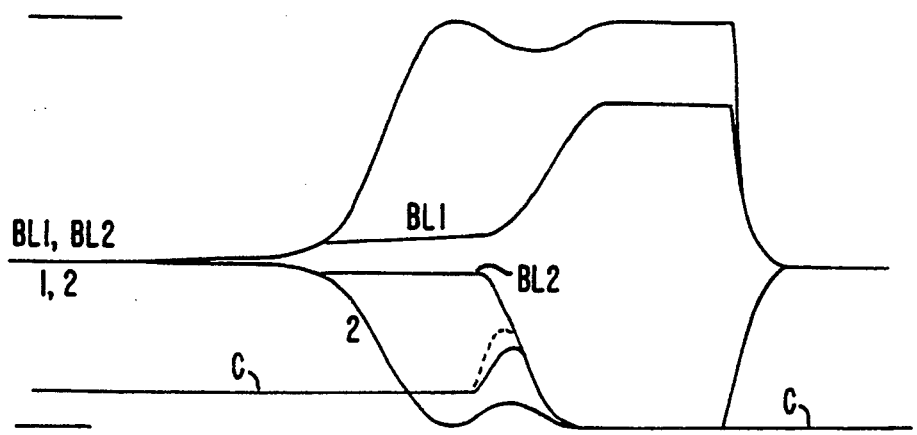

If a boosted word line is utilized, as illustrated in FIG. 9B, the high going bit line must go higher to secure the maximum amplitude on C. The refreshing of the capacitor voltage takes a very short time if the previous conditions have been satisfied so WL0 can be returned to ground as soon as it reaches its peak value. By comparison, a timing diagram for a low charge (i.e., a zero value) on C is shown in FIG. 9C.

Figure 9D:
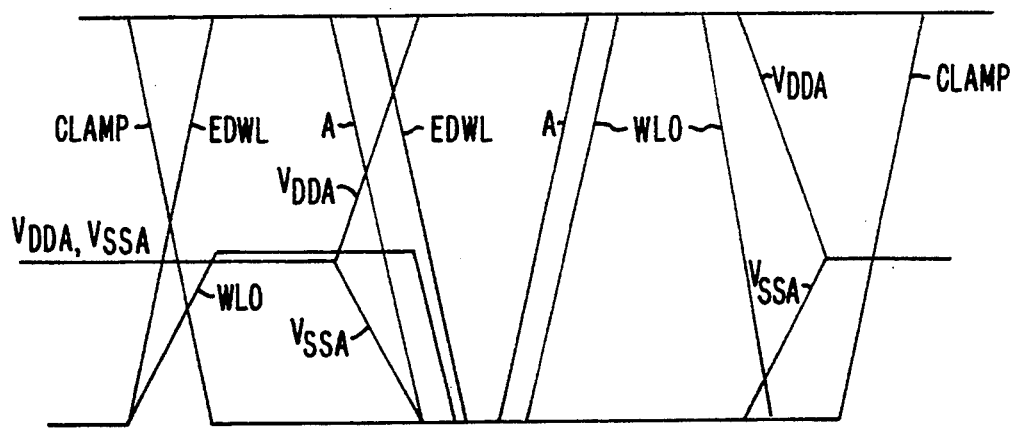
Figure 9E:
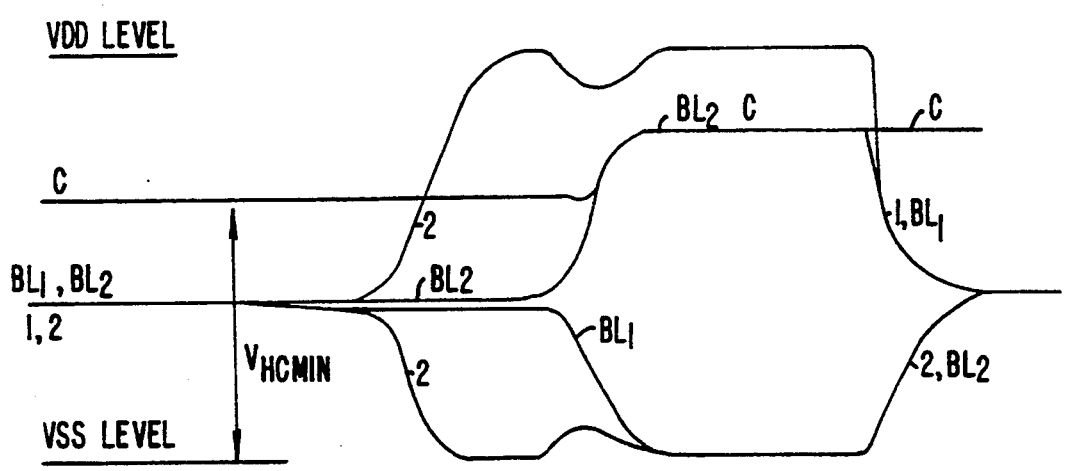
Figure 9F:
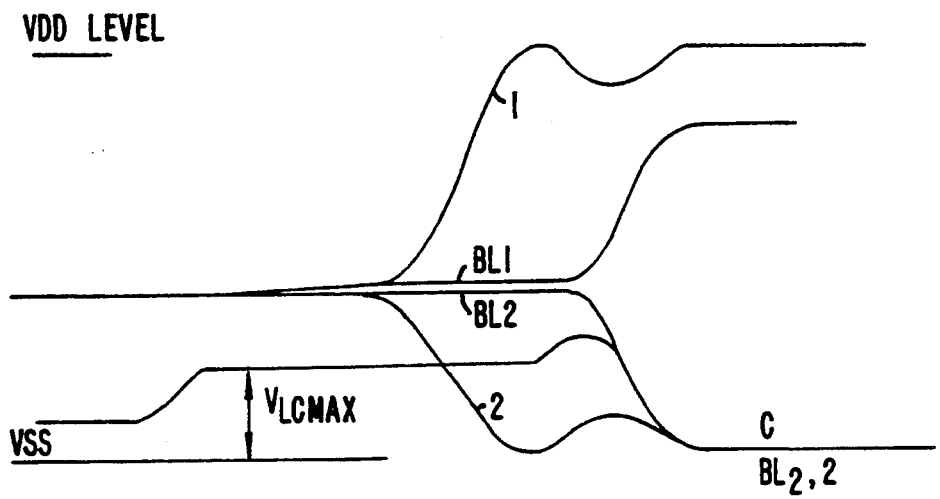

In the discussion above the assumption was made that the write transistor N3 in the storage cell had a higher threshold voltage than the rest of the transistors in the cell. This is necessary for the cells where reading and writing is made from the same bit line. It also provides very good margins when separate bit lines are used for reading and writing. A slight relaxation in the operating margins will, however, permit the use of the same threshold voltage for all three transistors in the cell having, for example, the folded bit line configurations that are illustrated in FIGS. 6 and 8. The timing diagrams in FIGS. 9D, 9E, and 9F show the signal response of the circuit in FIG. 8, when all transistors in the cell have a threshold voltage of 0.7 volts. The word line voltage at reading is 2 volts and at writing, 5 volts. The control signals are shown in FIG. 9D. The responses for a high voltage on C are shown in FIG. 9E. The responses for a low voltage on C are shown in FIG. 9F.

In reading, a high C is not disturbed by the low threshold on N3 as N3 is never turned on in the read mode. WL0 is at 2 volts, BL2 is at 2 volts, and C is higher than a specified minimum voltage. The minimum voltage is controlled by the frequency of the refresh cycle. For purposes of discussion, the minimum high voltage at reading is assumed to be 3 volts. With the word line at 2 volts and the gate of N1 at 3 volts, the current through N1 and N2 must be twice the current through the dummy transistor for correct operation. With half of the voltage drop across N1, the current through N1 with 3 volts on the gate is approximated by:

$$I_{N1} = k \times ((V_g - V_t) \times V_d - .5 \times V_d^2)$$
$$= k \times ((3 - .7) \times 1 - .5)$$
$$= k \times 1.8$$

Therefore, the dummy current is $k \times 0.9$.

The reading of a cell with a low voltage on the storage capacitor is illustrated in FIG. 9F. In this case, when WL0 is brought to 2 volts, N3 is turned on, pulling C up to a level one threshold below WL0, which is approximately 1.2 volts. This turns on N1, which will try to pull down BL1 with a current of about:

$$I_{N1} = k \times (V_g - V_t)^2$$
$$= k \times (1.2 - 0.7)^2$$
$$= k \times 0.25$$

At the same time, however, the dummy transistor is pulling BL1 toward the 5-volt supply with a current of $k \times 0.9$, which is much larger than the introduced pull down current.

It is clear that the three-device cell can operate safely even if N3 has the same threshold voltage as the other devices in the cell if the cells are refreshed often enough. An additional advantage is that the high voltage on a refreshed cell will be higher without resorting to excessive boosting of the word line at writing. However, an advantage of using a boosted word line at writing is that the margins for the memory cell will be even larger. Furthermore, a word line voltage lower than the 2 volts used in the example will also increase the margin.

Cell Layout

As mentioned before, the memory cells according to this invention require much smaller cell capacitors than the one transistor cell. This makes it possible to use single layer and planar capacitors. The advantage of this is that standard manufacturing processes can be used for memory chips of relatively large capacity.

Figure 10:
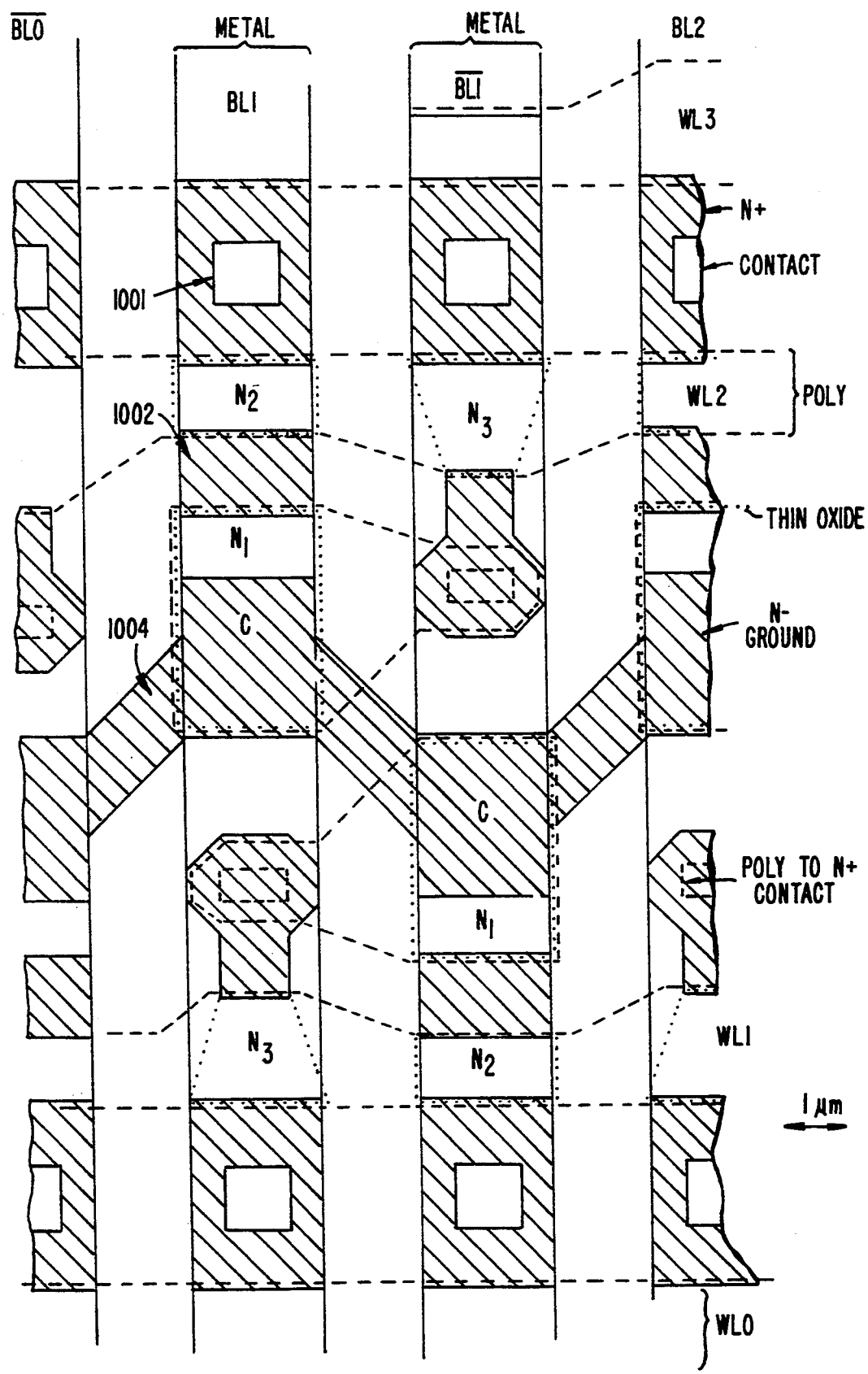
FIG. 10 illustrates a typical cell layout.

FIG. 10 shows a part of an array of cells laid out using 1 μm design rules. Shown are four pairs of folded bit lines, BL0bar, BL1, BL1bar, and BL2. Four word lines are shown, WL3, WL2, WL1 and WL0, where WL2 can be assumed to be the even word line in the WL1/WL2 pair. The bit lines, which are assumed to be the first metal, are running vertically and connect to the common drain diffusions for the cells associated with the word line pairs. The following discussion considers the cells located between WL1 and WL2 and connected to BL1 and BL1bar. The top cell has the read transistor N2 with its drain to the bit line node 1001. The gate of N2 is the poly or polysilicide word line WL2, and the drain is a short N− diffused area 1002 between WL2 and the gate to N1. The drain for the write transistor N3 is connected to BL1bar and the gate is also WL2. The source of N3 is connected to the combined storage capacitor/gate to N1. The source for N1 is a grounded N− diffusion 1004 running across the array essentially in parallel with the word lines. The ground diffusion is periodically tied to metal ground or, if substrate ground is used, to substrate ground. The enclosure of a thin oxide is indicated with dotted lines. The thin oxide under C covers both the gate of N1 and a large portion of the ground diffusion. The capacitance of C has contribution from the source junction of N3, from gate over ground diffusion, and from inversion in the gate area between ground and N1 drain/N2 source. The pattern of pairs of cells repeats itself in both horizontal and vertical directions. This cell with 1 μm design rule occupies 50 μm². Direct scaling to finer design rules would reduce the size according to Table 1, below.

TABLE 1

| Scaling of Cell in FIG. 10 | |
| --- | --- |
| Design Rule in μm | Cell Area in μm² |
| 1.0 | 50.0 |
| 0.8 | 32.0 |
| 0.6 | 18.0 |
| 0.5 | 12.5 |

TABLE 1-continued

| Scaling of Cell in FIG. 10 | |
| --- | --- |
| Design Rule in μm | Cell Area in μm² |
| 0.3 | 4.5 |
| 0.25 | 3.1 |

Figure 11:
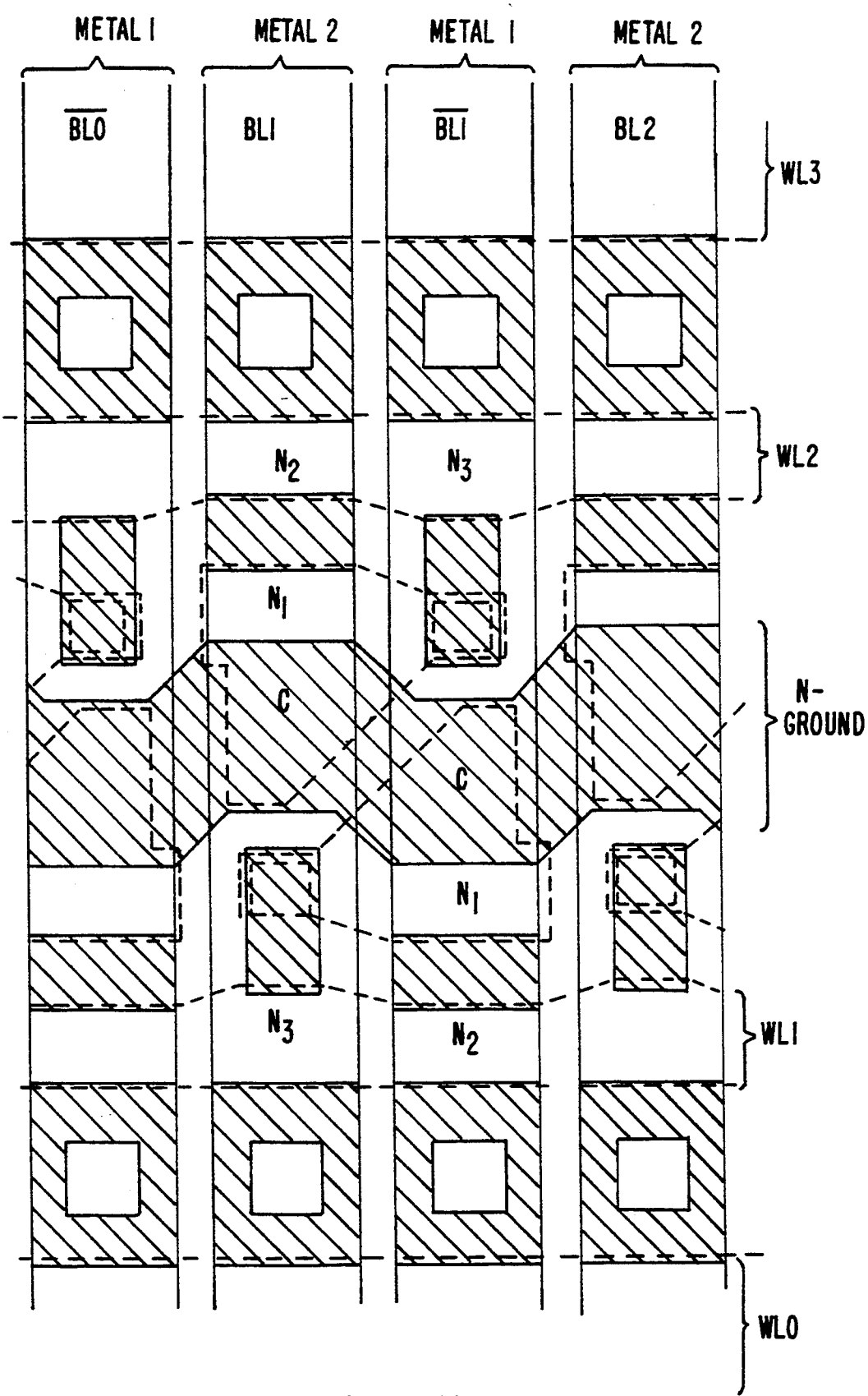
FIG. 11 illustrates a cell layout with trench isolation.

In FIG. 11 the same cell structure has been drawn assuming that trench isolation has been used. A trench width of 0.5 μm was arbitrarily chosen, which resulted in a cell size of 25 μm². The scaling of this cell is shown in Table 2, below.

TABLE 2

| Scaling of Cell in FIG. 11 | |
| --- | --- |
| Design Rule in μm | Cell Area in μm² |
| 1.0 | 25.0 |
| 0.8 | 16.0 |
| 0.6 | 9.0 |
| 0.5 | 6.2 |
| 0.3 | 2.2 |
| 0.25 | 1.6 |

It is clear that scaling the cell area also decreases the area of the storage capacitor. But, a corresponding reduction in the gate oxide thickness to maintain the capacitance value cannot be expected due to processing tolerance restraints. Hence, when using a dielectric of silicon oxide and or silicon nitride, special provisions must be made to increase the capacitance per unit area. Another possible alternative for achieving greater capacitance, while still maintaining a planar or flat capacitor, is to use ferroelectric materials as the dielectric for the capacitor. For the very highest capacities and finest design rules the same technique as is being planned for 256 Mb memories can be used, with the distinct advantage that a much smaller capacitor can be used with the cell type of this invention.

Figure 12:
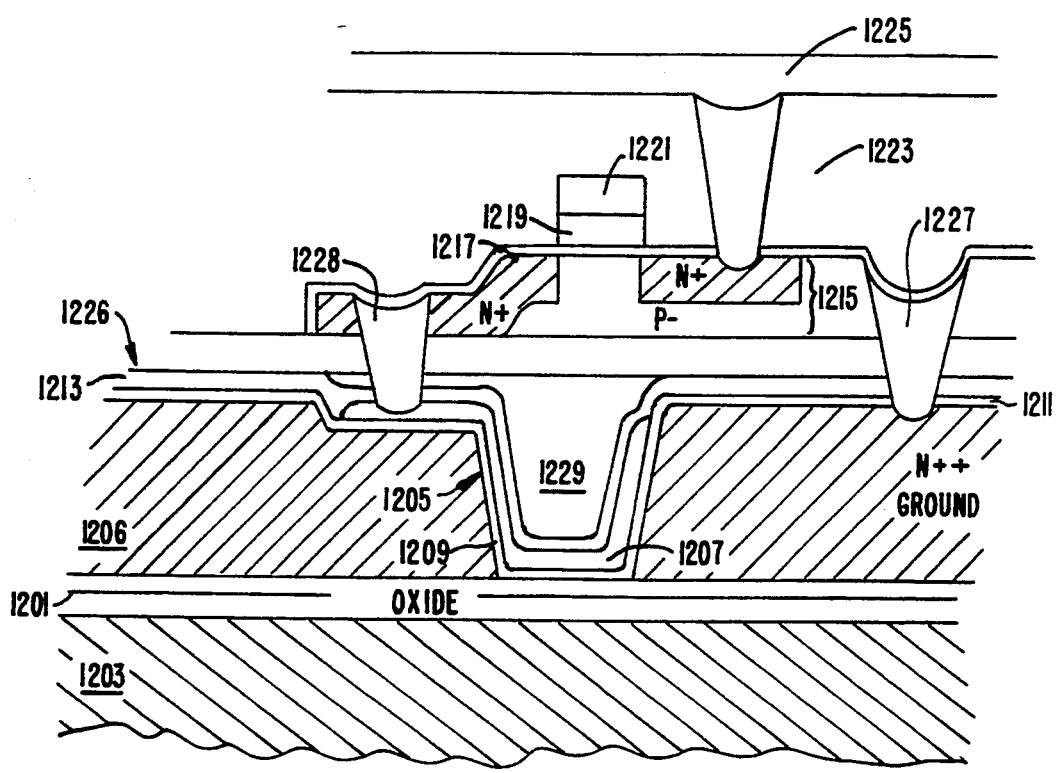
FIG. 12 is a cross-section of one embodiment of a DRAM cell.
Figure 13:
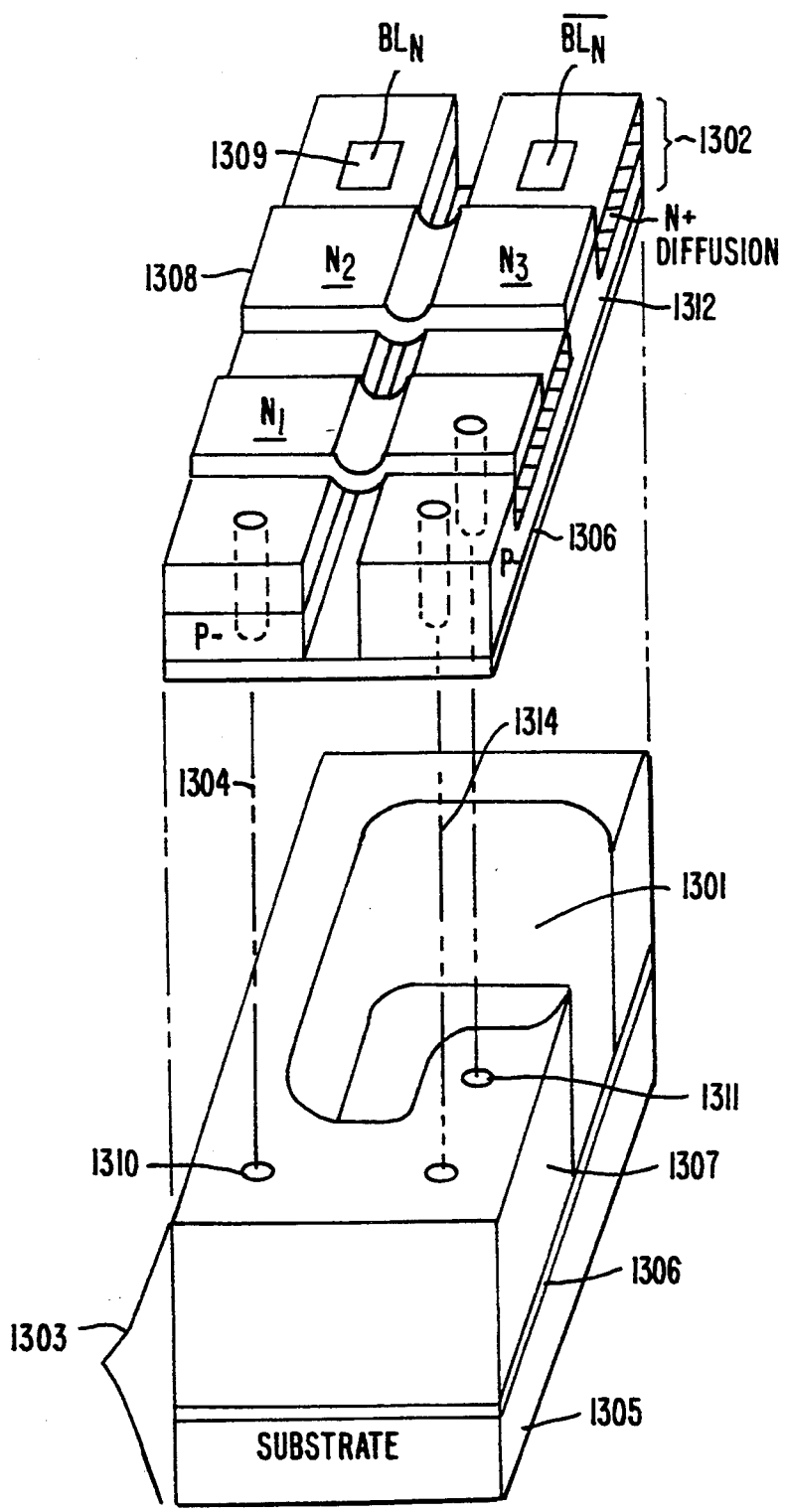
FIG. 13 illustrates a cross-section of a memory cell in two levels with a trench capacitor.

FIGS. 12 and 13 illustrate cross-sections of an alternative embodiment of the invention aimed at the very high capacity memories of high speed and are therefore using the technique of multilevel integrated circuits employing fused oxide layer as described in principal in U.S. Pat. No. 4,829,018, incorporated herein by reference for all purposes. FIG. 12 illustrates a cross-section of a single read/write transistor and the associated storage capacitor. As shown therein, the device includes an oxide layer 1201 on a support wafer 1203. The trench capacitor 1205 is formed in a low resistivity N++ substrate or as shown in the figure, in a fused N++ layer 1206. The trench capacitor is formed in the N++ layer with a plateau as shown to facilitate connection of the capacitor to transistors in the upper fused and thinned layer. After forming the trench, a thin oxide 1209 is formed followed by selective deposition of polysilicon 1207 in the trench and plateau areas. A second oxidation step forms oxide layer 1213. This oxide layer will interface to the oxide of the wafer holding the P epi layer, which is fused and thinned.

Oxide layer 1211 is formed before fusion and is further covered by oxide layer 1213. Using this method, a void 1229 is created above the trench capacitor between layer 1213 and the fusion interface 1226. Silicon layer 1215 is fused and connected to the capacitor by penetrating the oxide to contact the poly 1207. Layer 1215 includes n+ regions forming sources and drains of a transistor and is covered by a gate oxide-layer 1217. A gate is formed on the gate oxide layer over a p— channel region and is preferably formed from a polycrystalline layer 1219 overlaid by a self aligned silicide layer 1221. Contact 1228 connects the source of the transistor to the poly of the trench capacitor. Contact 1227 connects the substrate ground. A planarization oxide layer 1223, such as BSG, covers the transistor. The oxide layer 1223 penetrated by a metal bit line 1225.

The method for designing multilevel integrated circuits employing fused oxide layers was described in U.S. Pat. No. 4,829,018. The patent describes how one transistor DRAM cell can be designed, using stacked capacitor electrodes. The same technique for designing the capacitor can be used for this type of cell.

According to one aspect of the invention herein, the number of required fusion and thinning steps is reduced by way of the structure illustrated by FIG. 12. In the cell of FIG. 12, two fusion and thinning steps are made onto a support wafer, resulting in two active layers. The first active layer is a low resistivity N+ layer, connected to ground, deep enough to give an acceptable capacitor area. This layer is separated from the support wafer with a relatively thick oxide layer. The capacitors are processed into this layer as follows:

1. As a support wafer, use a first silicon substrate and grow a good quality oxide on the top surface.

2. Then, use a second silicon substrate wafer. Grow up to a 5 μm thick low resistivity epi layer on a surface of this second substrate. Then, grow a good quality oxide on a surface of the epi layer. Depending on the etchant used, the second substrate wafer can be of high or low resistivity. If a low resistivity wafer is used, grow a thin, high resistivity epi layer, for use as an etch stop, before growing the 5 μm low resistivity epi layer. Stack the first and second wafers together with the oxides facing each other. Fuse the wafers together.

3. Thin the second wafer by etching, leaving the 5 μm low resistivity epi layer.

4. Apply nitride and photo resist. Mask for the contact areas. Etch through the nitride. Follow with a shallow silicon etch to recess the contact areas.

5. Remove the resist. Oxidize in the contact areas.

6. Apply new resist and mask the cell areas. Remove the nitride in the cell areas.

7. Remove the resist.

8. Anisotropically etch through the 5 μm epi layer down to the fusion interface to form the trench for the capacitor.

9. Grow a thin oxide or oxynitride layer.

10. Apply polysilicon.

11. Etch the nitride surrounding the cell areas, thereby lifting off unnecessary polysilicon. Step 9, above, can be followed by a photoresist and masking step to create openings in the cell areas. This would simplify the lift-off step, but will make the cleaning of the wafers more difficult.

12. After the nitride is removed, the wafer has a substantially planar surface with recessed contact and trench areas. This wafer with fused layers is oxidized. Then, a third substrate wafer is used. A thin P— epi layer and then a good oxide layer is formed on a surface this third wafer. This third substrate wafer is stacked with the wafer with fused layers so that the oxide layers are facing each other. The wafers are fused.

13. The substrate of the third wafer is now removed by etching. The P— layer can act as etch stop. As an alternative technique, a thin silicon layer can be formed, by zone crystallization or similar means, on top of the interoxide layer on the third wafer. Then, the interoxide layer acts as the etch stop for removal of the substrate of the third wafer, while the thin silicon layer will stop the oxide etch as needed.

14. Regardless of how thin the P− layer is, this layer is used to make the select transistor for the DRAM.

The capacitor can be built directly into a solid N+ wafer, but it has been found that oxidation thickness in a deep hole will decrease toward the bottom. Having a thick oxide in the bottom, not only provides an effective etch stop but also gives higher thin oxide integrity at the bottom of the hole.

The capacitor in the N+ layer is a pure accumulation capacitor and is exposed to leakage only through its thin oxide. This is contrary to other trench capacitors, that have a junction as part of the capacitor. The thin transistors used in this design are separated from each other by cuts to the oxide layer between the transistor layer and the capacitor layer. If the gate area is thin enough to be completely depleted when the gate is high, no substrate connection is required and the source and junction areas are very small. This type of select transistor is very fast. Such thin substrates can only be made by deposition and zone crystallization, requiring sufficient process control to be practical. The tolerance inherent in the method of anisotropic etching of the bulk of a wafer down to one epi layer is not high enough to produce super thin transistors. Consequently, these transistors, which are not super thin, need a substrate connection for proper operation. By using two stacked epi layers with different resistivity and two anisotropic steps followed by an etch of the uppermost epi layer (the layer now closest to the oxide interfacing to the capacitor layer) and under optic control, super thin transistors can be made.

The three-transistor cell, as discussed before, operates with a much smaller capacitor, so that building the capacitor directly into an N+ support wafer is feasible. A trench or hole of 0.5 $\mu$m diameter and 2 $\mu$m depth should give sufficient capacitance. It should be understood that as the dimensions of the devices shrink, the bit line capacitance is also reduced. The transistor in series with the capacitor, that provides the main path for leakage current, gets narrower while the length is reduced only slightly. For the same refresh cycle time as used for memory cells made adhering to larger design rules, cells made using smaller design rules may use reduced size capacitors.

FIG. 13 shows one configuration for a cell in 2 levels, where the bottom level 1303 holds a trench capacitor 1301. All transistors, N1, N2, and N3, are located in the top layer, 1302. N1, N2, and N3 are NMOS transistors formed in a P− epitaxial layer 1312. The P− epitaxial layer is contacted to ground by contacts 1304 and 1314. The polysilicon word line 1308 and bit line contact 1309 are in the top layer. The substrate 1305 in the bottom layer is covered by a fusion interface oxide layer 1306. The trench capacitor is formed in an N++ substrate layer 1307. Refer to FIG. 12 and the above text describing the figure for a detailed discussion of the trench capacitor and bottom layer.

The transistors are isolated from each other. Furthermore, in the following discussion, the transistors are not super-thin transistors. Therefore, substrate connections are shown. The source of N1 is connected to substrate ground and the P− epitaxial layer by contact, as shown by 1304. For thicker transistors, the ground plug 1310 for the source of N1 also connects to the substrate for N1 and N2, while an extension of the substrate portion for N3 toward the lower right corner has a plug 1311 down to the substrate ground. The separate substrate ground will permit full separation of the transistors. Conventional processing can naturally be applied to the top layer as long as provisions are made to connect devices in the top layer with the capacitor and the ground in the bottom layer. For example, the source of transistor N3, 1312, is connected to the trench capacitor 1301.

Figure 14A:
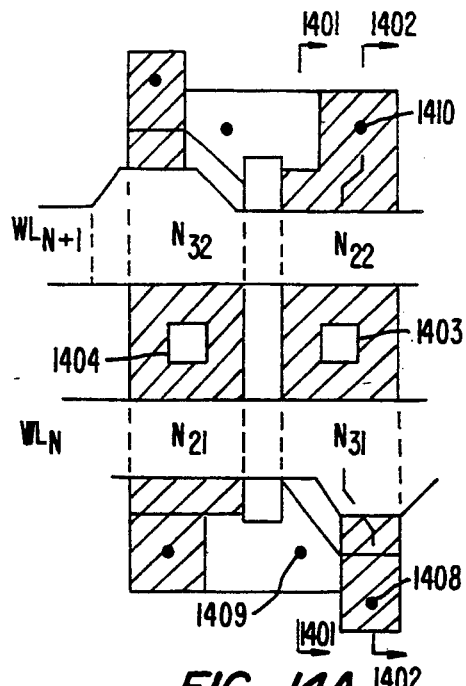
FIGS. 14A to 14D illustrate a layout and cross-section of a memory cell with a flat double-sided capacitor.
Figure 14B:
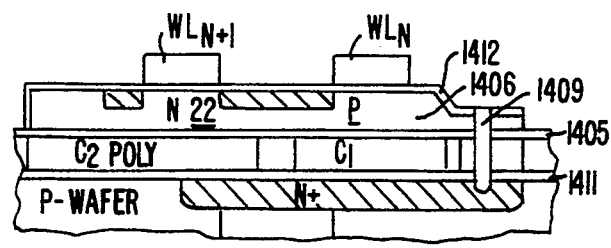
Figure 14C:
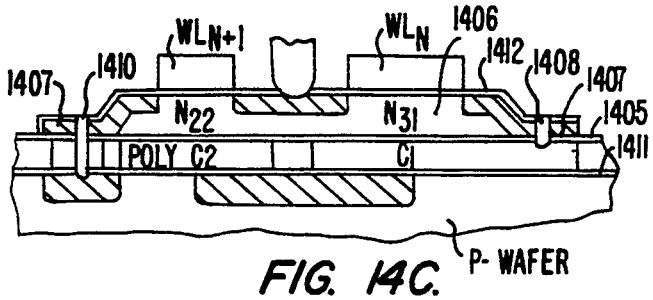
Figure 14D:
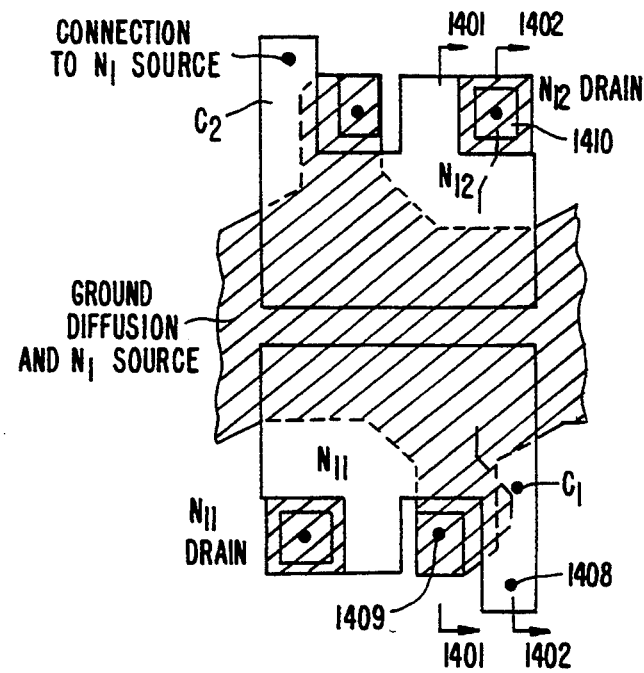

FIGS. 14A to 14D show a different approach for making the memory cell. This involves having two memory cells that are folded together, as described previously; the circuit schematic for this configuration is shown in FIG. 8. The layout of these cells is shown in FIG. 14A. A flat or planar capacitor (e.g., C1 and C2) for each memory cell is located on the surface of the P− support wafer. FIG. 14A shows the layout of the devices in the top layer and FIG. 14D is for the bottom layer. N31, N21, N11, and C1 are the devices forming one of the memory cells, while N32, N22, N12, and C2 are for the other. Polysilicon word line WL$_{N+1}$ connects and forms the gates of N32 and N22. Similarly, poly word line WL$_N$ connects and forms the gates of N31 and N21. Bit line connections to the memory cells are made through contacts to the drains of N32 and N31, 1403 and 1404, respectively.

FIGS. 14B and 14C are side views of the structures in planes perpendicular to lines 1401 and 1402, respectively, shown in FIGS. 14A and 14D. To form capacitors C1 and C2 in the bottom layer, gate oxide 1404 is grown across the whole surface of the support wafer, followed by polysilicon layer, which is shown in FIGS. 14B and 14C. As in FIG. 14D, transistors N12 and N11 are also formed in the bottom layer. The shape of the gate and pads around intended contact points are etched. A thin oxide is grown on top of the poly layer. On a second wafer, a thin oxide is grown over a P− epi layer on the wafer's surface. The two wafers are stacked together with the oxide layers touching. Then, the two oxide surfaces are fused together to form a thin fusion interface 1411. The bulk of the second wafer is removed as described in the aforementioned patent, leaving a P− epi layer 1406. Areas where feed-through contacts will be made are etched thinner than the rest of the now exposed epi layer.

Next, source and drain implants are made deep enough so that N+, after diffusion, penetrates the thinned contact areas 1407. Contact holes of two different depths are made. The shallower contact 1408 penetrates N+ of N31's source and the fusion interface to the poly layer of the capacitor. Two deeper contacts, 1409 and 1410, connect the P− substrate to the ground bus and connect the drain of N12 to the source of N22. After filling the contact holes, a nitride mask is used to grow a preliminary gate oxide for N31 and N32 transistors followed by growing gate oxide 1412 on the whole area. The word line poly/polysilicide is applied and etched, followed by the standard procedure for isolating and contacting the metal buses to the cells.

Notice that the capacitor is double-sided. There is a capacitive contribution from a first side-the poly over gate oxide 1411 to the grounded n-diffusion regions and to an inversion layer the gate area in the support substrate. Further capacitive contribution comes from a second side-the poly beneath a thin fusion interface oxide 1405 to the grounded epitaxial layer. The capacitance on the second side increases as the fusion interface oxide is made thinner. However, the degree to which the fusion interface can be made thinner is governed byprocess tolerances. Overall, using this method, larger capacitances can be made per unit area. Also, it is recognized that this method for making multisided capacitors can be extended indefinitely by stacking more epitaxial layers, alternating between multiple gate oxide and thin fusion interface layers. As a result, the amount of capacitance can be extended indefinitely, limited by the number of layers in the process.

Because of the double-sided capacitor, the memory cell configuration in FIGS. 14A to 14D provide a reasonable balance between cell size and cell capacitance even if the cell through scaling is shrunk to about 1 $\mu m^2$, as would be the case at 0.25 $\mu m$ design rule. Table 3, below, is a first approximation of the result of scaling to smaller dimensions. Some minor scaling of gate oxide thickness was made in estimating the gate capacitance, but even at 4 fF storage capacitance, this type of cell would work reliably at the proper refresh frequency.

TABLE 3

| Scaling of Cell in FIGS. 14A to 14D | | | |
|---|---|---|---|
| | Cell | | Capacitor |
| Rule in $\mu m$ | Size $\mu m^2$ | Size $\mu m^2$ | Capacitance fF |
| 1.0 | 15.0 | 16.0 | 48 |
| 0.8 | 9.6 | 10.2 | 31 |
| 0.6 | 5.4 | 5.8 | 18 |
| 0.5 | 3.75 | 4.0 | 14 |
| 0.3 | 1.35 | 1.44 | 6 |
| 0.25 | 0.94 | 1.0 | 4 |

The above description is illustrative and not restrictive. Many variations of the invention will become apparent to those of skill in the art upon review of this disclosure. Merely by way of example different transistor structures, doping patterns, and the like may be utilized. The scope of the invention should, therefore, be determined not with reference to the above description, but instead should be determined with reference to the appended claims along with their full scope of equivalents.

What is claimed is:

1. A dynamic random access memory comprising:
   a plurality of memory cells at the intersections of word lines and bit lines, said memory cells being coupled to a folded bit line, each memory cell comprising:
   a storage capacitor for storing charge representative of a stored value;
   a first, write transistor coupled to a first plate of said storage capacitor and a first bit line; and
   a second, read transistor having a first terminal thereof coupled to a first terminal of a third transistor and a second terminal coupled to a second bit line, said third transistor comprising a gate coupled to said first plate of said storage capacitor, said word line coupled with a gate of both said read transistor and said write transistor; and
   a sense amplifier coupled to said folded bit line.

2. A dynamic random access memory as recited in claim 1 further comprising a fourth transistor coupled to said first bit line and ground, said fourth transistor permitting said first bit line to lose voltage at a reduced rate compared to said second bit line when reading a high charge from said storage capacitor 3. A dynamic random access memory for integrated circuits, comprising a plurality of memory cells, each memory cell comprising:
   a storage capacitor in a first semiconductor layer;
   transistor elements in a second semiconductor layer, above said first semiconductor layer, wherein said first and second semiconductor layers are substantially parallel with a surface of a substrate wafer, and said capacitor is directly beneath said transistor elements; and
   said storage capacitor is coupled to said transistor elements.

4. A dynamic random access memory as recited in claim 3 wherein said capacitor is a trench capacitor.

5. A dynamic random access memory as recited in claim 3 wherein said capacitor is a planar capacitor.

6. The dynamic random access memory of claim 2 wherein said second bit line being pulled low by said sense amplifier upon reading said high charge from said storage capacitor and said first bit line being pulled high by said sense amplifier upon reading said high charge from said storage capacitor.

7. The dynamic random access memory of claim 6 wherein said second bit line being at a low level and said first bit being at a high level when writing a high charge to said storage capacitor.

8. The dynamic random access memory of claim 1 further comprising a fourth transistor coupled to said second bit line and a high potential level, wherein said second bit line being pulled up to a high level when reading a low charge from said storage capacitor and said second bit line being pulled down to a low level when reading a high charge from said storage capacitor.

9. The dynamic random access memory of claim 1 further comprising a fourth transistor coupled to one of said bit lines of said folded bit line, said fourth transistor displacing the potential levels on said bit lines relative to each others in the opposite direction of the displacement caused by a reading of said stored charge at a rate less than the rate of displacement caused by said reading of said stored charge.

10. The dynamic random access memory of claim 1 further comprising a fourth transistor coupled to said second bit line and a high potential level, said second bit line being pulled lower than said first bit line against a source current from said fourth transistor when reading a high charge from said storage capacitor, said fourth transistor pulling said second bit line higher than said first bit line when reading a low charge from said storage capacitor.

11. A dynamic random access memory access comprising:
   a plurality of memory cells at the intersections of word lines and bit lines, said memory cells being coupled to a folded bit line, each memory cell comprising:
   a storage capacitor for storing charge representative of a stored value;
   a first, write transistor coupled to a first plate of said storage capacitor and a first bit line; and
   a second, read transistor having a first terminal thereof coupled to a first terminal of a third transistor and a second terminal coupled to a second bit line, said read transistor having a lower switching threshold than said write transistor, said third transistor comprising a gate coupled to said first plate of said storage capacitor, said word line coupled with a gate of both said read transistor and said write transistor;
   a fourth transistor coupled to said first bit line and ground, said fourth transistor permitting said first bit line to lose voltage at a reduced rate as compared to said second bit line when reading a high charge from said storage capacitor;
   a fifth transistor coupled to said first bit line and a clamp line having a clamp level, said clamp level being intermediate to ground and a switching threshold of said write transistor; and
   a sense amplifier coupled to said folded bit line.

* * * * *